United States Patent [19]
Granot

[11] Patent Number: 5,124,650
[45] Date of Patent: Jun. 23, 1992

[54] MAGNETIC RESONANCE DATA ACQUISITION FROM LOCALIZED VOLUMES

[75] Inventor: Joseph Granot, Holon, Israel
[73] Assignee: Elscint Ltd., Haifa, Israel
[21] Appl. No.: 556,384
[22] Filed: Jul. 24, 1990

[30] Foreign Application Priority Data

Jul. 26, 1989 [IL] Israel ........................................ 091120

[51] Int. Cl.$^5$ ............................................ G01R 33/20
[52] U.S. Cl. .................................. 324/309; 128/653.1
[58] Field of Search ............... 324/300, 307, 309, 318, 324/322; 128/653 A, 653 R

[56] References Cited

U.S. PATENT DOCUMENTS

| | | | |
|---|---|---|---|
| 4,015,196 | 3/1977 | Moore et al. | 324/309 |
| 4,021,726 | 5/1977 | Garroway | 324/309 |
| 4,531,094 | 7/1985 | Ordidge et al. | 324/309 |

OTHER PUBLICATIONS

Communications: Selected Volume Excitation Using Stimulated Echoes (Vest), Applications to Spatially Localized Spectroscopy and Imaging. Joseph Granot, Journal of Magnetic Resonance, 70, pp. 488–492, (1986).

Primary Examiner—Michael J. Tokar
Attorney, Agent, or Firm—Sandler, Greenblum, & Bernstein

[57] ABSTRACT

Obtaining data from a plurality of slabs in a volume of interest by using pairs of 90° pulses with individual gradient pulses for presaturating volumes not of interest in the subject and subsequently selecting slabs in the volume of interest with RF pulses and slice-selecting gradient pulses.

24 Claims, 5 Drawing Sheets

MAGNETIC RESONANCE DATA ACQUISITION FROM LOCALIZED VOLUMES

FIELD OF THE INVENTION

This invention is a patent of Application, Ser. No. 543,492 filed on Jun. 26, 1990, and relates to magnetic resonance (MR) data acquisition and more particularly to methods for spatially limiting the volume of interest during MR studies either for magnetic resonance spectroscopy (MRS) or for magnetic resonance imaging (MRI). Pertinent prior art is listed in two prior Applications which have since issued as patents, i.e., U.S. Pat. Nos. 4,832,037 and 4,878,021. The aforementioned Application and Patents describe inventions by the inventor of the present invention and are assigned to the Assignee herein.

BACKGROUND OF THE INVENTION

When acquiring MR data it is relatively easy to control location, area dimensions and the thickness of each of the slices and to obtain data from the entire slice. (A slice as used herein includes "slab" which is defined as a slice with greater than normal thickness). However, when there is a particular section, such as a localized volume in a larger excited volume of interest (VOI) it is more difficult to obtain data from that localized volume and exclude data from the rest of the VOI. The capability of obtaining data from a particular localized volume within a larger excited volume is especially important for in-vivo spectroscopy. Such a capability will, for example, enable acquiring spectroscopic data exclusively from diseased portions of organs for comparison with data exclusively from healthy portions of the organs.

One of the prior art methods of volume localization uses surface coils. If the region of interest is a relatively small volume, a small coil has to be used to obtain localized data. However, small coils have limited penetration depths and thereby preclude obtaining data from volumes that are not superficial.

There are other prior art methods for selective volume excitation. See for example, a communication in the Journal of Magnetic Resonance, Volume 70, pages 488–492 (1986) entitled "Selected Volume Excitation Using Stimulated Echoes (VEST). Applications to Spatially Localized Spectroscopy and Imaging", written by the inventor herein. In the procedure explained in the communication, a volume of interest is excited using stimulated echoes with Gx, Gy and Gz gradients.

In the prior art it is known to obtain data localized to a given VOI; for example, in the form of a three dimensional solid bar by saturating the volumes surrounding the volume of interest. The prior art, however, does not teach an effective process and/or system for acquiring data from multiple localized volumes in the VOI. Nor does the prior art teach an effective method of acquiring multiple volume data from elements such as 31P in-vivo because of its short T2 relaxation time.

If a diseased tumor is located in the head, for example, it is preferable to use a multiple volume scan to acquire data from the tumor and also from normal tissue. To focus on the tumor to the exclusion of extraneous data, a localized VOI basically containing the tumor should be excited to the exclusion of surrounding volumes. The slabs of the excited volume are used to obtain the requisite data, for example, to compare the tumorous tissue with healthy tissue. Hence it is important to be able to acquire data from the a multiplicity of slabs in a selected locally excited VOI.

Accordingly, there is a need for improved magnetic resonance spatial localization to obtain data from multiple localized volumes in a volume of interest. The spatial localization could also be used for acquiring 31P spectroscopic data or for imaging.

Clinical and research applications of in-vivo nuclear magnetic resonance spectroscopy (MRS) necessitate well defined spatial localization of the target VOI. This necessity led in the past several years to the discovery of a multitude of methods for spatial localization. Of these methods only few are suitable for studies of 31P because of the added constraint of short time interval between spin excitation and signal acquisition when dealing with short $T_2$ metabolites.

Accordingly, those skilled in the art are still searching for a spatial localization method which is applicable to both MRI and MRS to increase image resolution or to reduce scan times and to obtain data for 1-H or 31-P MRS.

BRIEF DESCRIPTION OF THE INVENTION

According to a broad aspect of the present invention, a localization method of MR data acquisition is provided that combines selective presaturation of volumes outside the VOI and selective excitation of one or more (slabs; i.e., localized volumes) within the VOI. An important advantage of the present method over the prior art is that it provides a shorter saturation period which materially reduces the dependence of the saturation efficiency on the T1 relaxation times. Another important advantage of the present invention is the ability provided to acquire spectral data from multiple localized volumes in a single scan.

According to a more particular aspect of the present invention, a method for acquiring data from multiple localized volumes in a volume of interest using a magnetic resonance acquisition sequence is provided, said method comprising the steps of:

a) determining a VOI in a subject of an MR examination, b) subjecting the subject under examination to a strong static magnetic field, c) presaturating volumes surrounding the determined VOI while leaving the VOI unsaturated to restrict the volume from which data is acquired to the determined VOI, d) selecting multiple localized volumes in the determined VOI, and e) acquiring data from each of said selected multiple localized volumes.

According to a feature of the present invention, a region or volume of interest is determined using such things as a prior diagnostic imaging examination or an MR pre-scan to determine the locality of a tumor, for example.

According to another feature of the invention, sections of the subject surrounding a VOI, containing a tumor, for example, are presaturated, said presaturation is accomplished by the steps of:

applying a first pair of 90° RF pulses during the application of a first gradient pulse to tip spins of volumes not of interest into transverse planes, said volumes not of interest being justaxposed to said VOI, and applying a second pair of 90° RF pulses during the application of a second gradient pulse to tip spins of volumes not of interest into transverse planes, said volumes not of interest being oriented in a second direction juxtaposed to said VOI, leaving a "bar" as the unsaturated VOI.

According to yet another feature of the present invention the invention includes the steps of obtaining data from multiple localized volumes of the bar;

said selecting steps comprising:

applying a basic scan sequence during a sequence time (TS) to select and acquire data from at least one of said multiple localized volumes, said basic sequence including: applying an RF pulse in the presence of a gradient pulse, said pulses having parameters for selecting a first localized volume in the volume of interest in said patient, acquiring data from the first localized volume, waiting a definite time period (TR) before reapplying said basic sequence with pulses having the same parameters, and reapplying the basic sequence during the definite period with pulses of different parameters for selecting other localized volumes, and acquiring data from said other localized volumes in said patient during said definite period.

According to an aspect of the invention, the different parameters include different frequencies for said RF pulse and/or include gradient pulses of different amplitudes and/or lengths.

According to yet another feature of the present invention, the different parameters include different bandwidths for said RF pulses.

The method also includes the steps of applying multiple RF pulses of different frequencies to select multiple localized volumes or slabs (slices with more than usual thicknesses where a usual thickness is in the order of 5-10 mm) in the patient, and applying a plurality of RF pulses of the same frequency to obtain a plurality of signals from localized volumes excited responsive to the application of each of the multiple RF pulses with the same frequencies, and averaging said plurality of signals to obtain useful signal-to-noise ratios.

According to yet another feature of the present invention the sets of 90° RF pulses used for saturation purposes are sets of frequency modulated 90° RF pulses.

According to another feature of the present invention means are provided for:

1) overcoming adverse eddy current effects;
2) exciting localized volumes (or slabs) that have efficiently and effectively defined boundaries,
3) acquiring data having relatively small relaxation time dependencies.

The adverse eddy current effects are effectively minimized by adding a delay time between the saturation step and the excitation step.

The boundaries of the localized volumes are clearly defined by using sinc excitation pulses.

The $T_1$ relaxation time dependency is minimized by the short saturation times of the inventive procedure. The $T_2$ relaxation time dependency is minimized by the short interval between excitation and acquisition.

According to another aspect of the present invention there is included the step of applying spoiler gradient pulses after at least some of said RF pulses to further dephase transverse magnetization to improve the saturation.

BRIEF DESCRIPTION OF THE DRAWINGS

The above mentioned and other features and objects of the present invention will become more readily apparent when the invention is considered in the light of the following description made in conjunction with the accompanying drawings; wherein.

GENERAL DESCRIPTION

Figure 1:
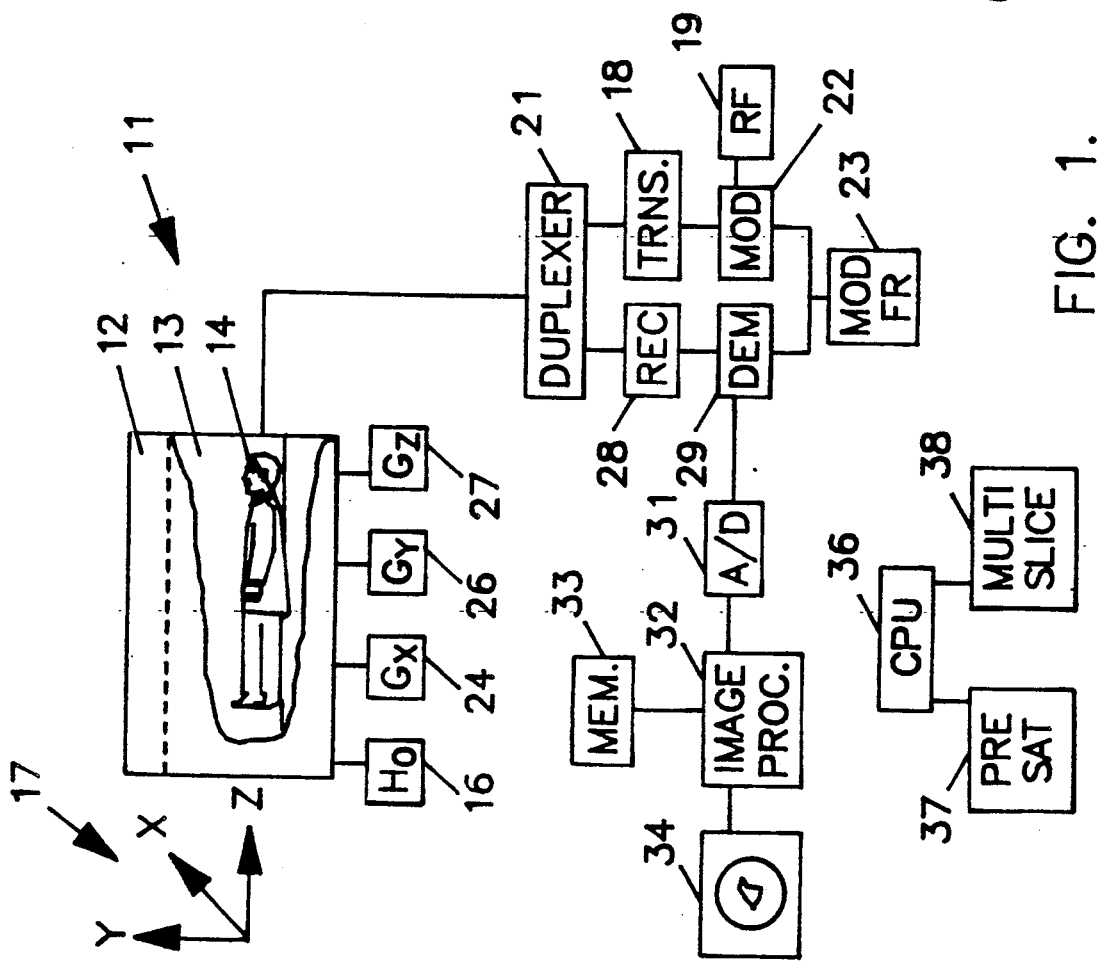
FIG. 1 is a block diagram of an MR data acquisition system using the invention.

FIG. 1 at 11 shows a magnetic resonance system for use either in acquiring magnetic resonance spectroscopic (MRS) data or magnetic resonance imaging (MRI) data in accordance with the present invention.

More particularly, FIG. 1 includes a magnet 12 used to generate a large static magnetic field. The magnet is sufficiently large to have a bore 13 therein capable of accommodating a patient 14 horizontally disposed inside the magnet. The magnetic field is produced by the magnetic field generator HO designated by the reference numeral 16. In a preferred embodiment, a superconducting type magnet is used. However, the instant invention is not limited to super-conducting type magnets. Permanent magnets or electro-magnetic magnets may also be used within the scope of the present invention.

According to present inventions the magnet is shown oriented in relation to an XYZ coordinate system shown at 17. As shown, the longitudinal axis of the bore of the magnet lies along Z axis.

It is well known that when a patient is in the magnet with the large static magnetic field applied to the patient, certain nuclei that possess unpaired spins tend to align themselves with the large static magnetic field.

Means are provided for "tipping" the aligned spins into the transverse XY plane. More particularly, a radio frequency transmitter 18 is provided. The radio frequency transmitter obtains its radio frequency signal from an RF generator 19. The transmitter applies radio frequency pulses through a duplexer 21 to a coil, not shown, in the magnet. The pulse in the instant invention is preferably sinc shaped. The shaping is accomplished with a modulator 22. The modulator receives its modulation frequency from modulation frequency generator 23. The sinc-shaped radio frequency pulse is applied to the coil and is of sufficient magnitude or length to tip the spins 90° into the XY plane. The spins may be only partially tipped towards the XY plane; the important thing, however, is that there is at least a projection of the tipped spins in the XY plane. The tipped spins in the XY plane precess at the Larmor frequency and thereby generate what are known as "free-induction decay" (FID) signals. The signals decay rather rapidly due to dephasing of the spins in the XY plane (T2 relaxation) and also due to the tendency for the spins to return to alignment with the large static magnetic field (T1 relaxation).

To determine the location of the source of the FID signals gradient pulses are used. Thus, there is shown, a GX gradient pulse generator 24, a GY gradient pulse generator 26 and a GZ gradient pulse generator 27. The gradients may be applied for selecting, encoding and/or viewing to determine the origin of the FID signals. The location of the origin of the FID signal is determined by the relationships between the RF pulse frequency and the strength of the magnetic field as affected by the gradient acting on the spins. The relationships are:

$$f_o = \gamma B_o / 2\pi$$

$$f_x = f_o + \gamma G x X / 2\pi$$

$$X = 2\pi (f_x - f_o) / \gamma G x$$

where:

$f_o$ is the Larmor frequency, $\gamma$ is the gyromagnetic ratio that is constant for each element, $B_o$ is equal to the strength of the static magnetic field, $\pi$ is the well known constant 3.1416+, $f_x$ is frequency of the RF pulse used with the Gx gradient x is the coordinate along the X direction, and $(f_x - f_o)$ is the offset frequency The FID signal is transferred through the duplexer 21 to the receiver 28. The received signal is demodulated in demodulator 29 and the analog demodulated signal is converted to digital signals in the A/D converter 31. The digital signals are processed in processor 32 which may use memory 33 to provide either graphic or imaging data on monitor 34.

The various operations of the system 11 are controlled and/or timed by a central processing unit (CPU) shown at 36. The central processing unit for the sake of clarity is not shown connected to the other units. However, it controls the timing, amplitudes and shapes of the control signals in the system and thus the CPU is connected to virtually every block of the system. The CPU of the present system is different than that of prior art systems, among other ways, because it includes controls for both presaturation and multi-slice operations as indicated at 37 and 38 respectively.

Figure 2:
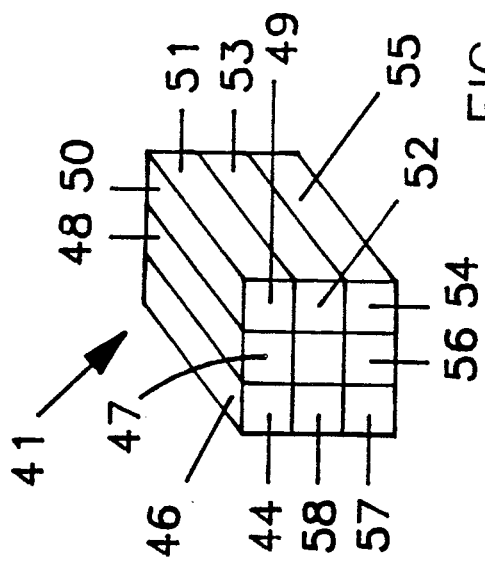
FIG. 2 shows a three-dimensional block of the subject of the MR acquisition scan sequence including a section or volume of interest.
Figure 2A:
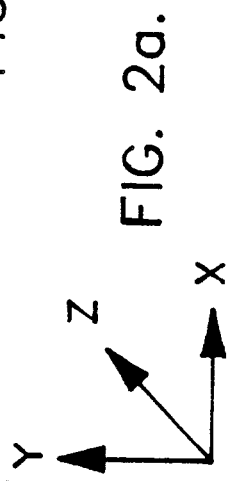
FIG. 2a shows X, Y and Z coordinates oriented with relation to the three dimensional block of FIG. 2.

The three-dimensional block 41 in FIG. 2 represents a three-dimensional section of the patient 14. The block 41 includes a section or volume of interest (VOI) 43 having a front face 42. It is an aim of the system described herein to obtain data from multiple localized volumes in VOI 43 as shown in FIG. 3.

The system and method as will be described is especially designed to obtain spectroscopic data from elements such as 31P which is a metabolate which has a short T2 and, therefore, the interval between spin excitation and signal acquisition must be short to be able to acquire a meaningful signal. The system and method in one embodiment thereof uses FID signal acquisition rather than echo signal acquisition to keep the interval between excitation and acquisition sufficiently short. Similarly, in the preferred imaging sequence a gradient echo scan sequence is used.

To acquire data limited to section 43, a presaturation step is accomplished prior to each excitation step. The presaturation step is designed to saturate all the block 41 except for the VOI 43. More particularly, the volumes having a face 44 and a top surface 46, having a face 47 and a top surface 48; having a face 49, top surface 50 and a side 51, having a face 52 and a side 53; having a face 54 and a side 55; having a face 56, having a face 57, and having a face 58 are saturated prior to each excitation step to assure that signals are obtained only from the VOI 43.

Figure 3:
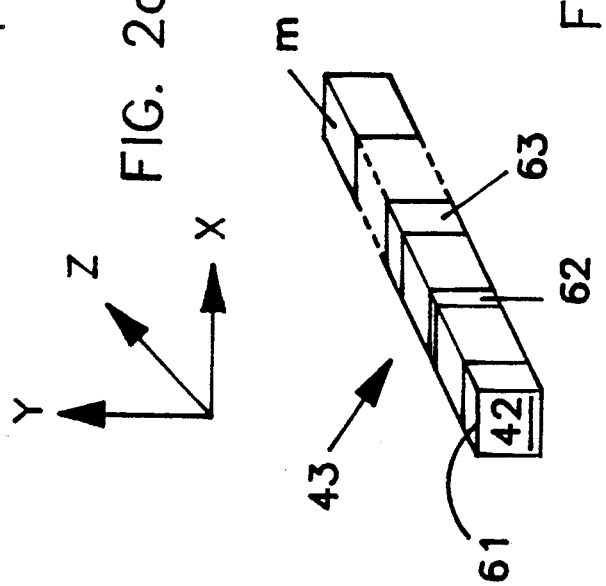
FIG. 3 shows details of the volume of interest taken from the three-dimensional section of FIG. 2.

Preferably, the data acquired from VOI 43 will be data from multiple localized volumes shown by way of example as slabs 61, 62, 63, and m in FIG. 3. The data according to the present invention can either be spectroscopic data or imaging data.

Figure 4:
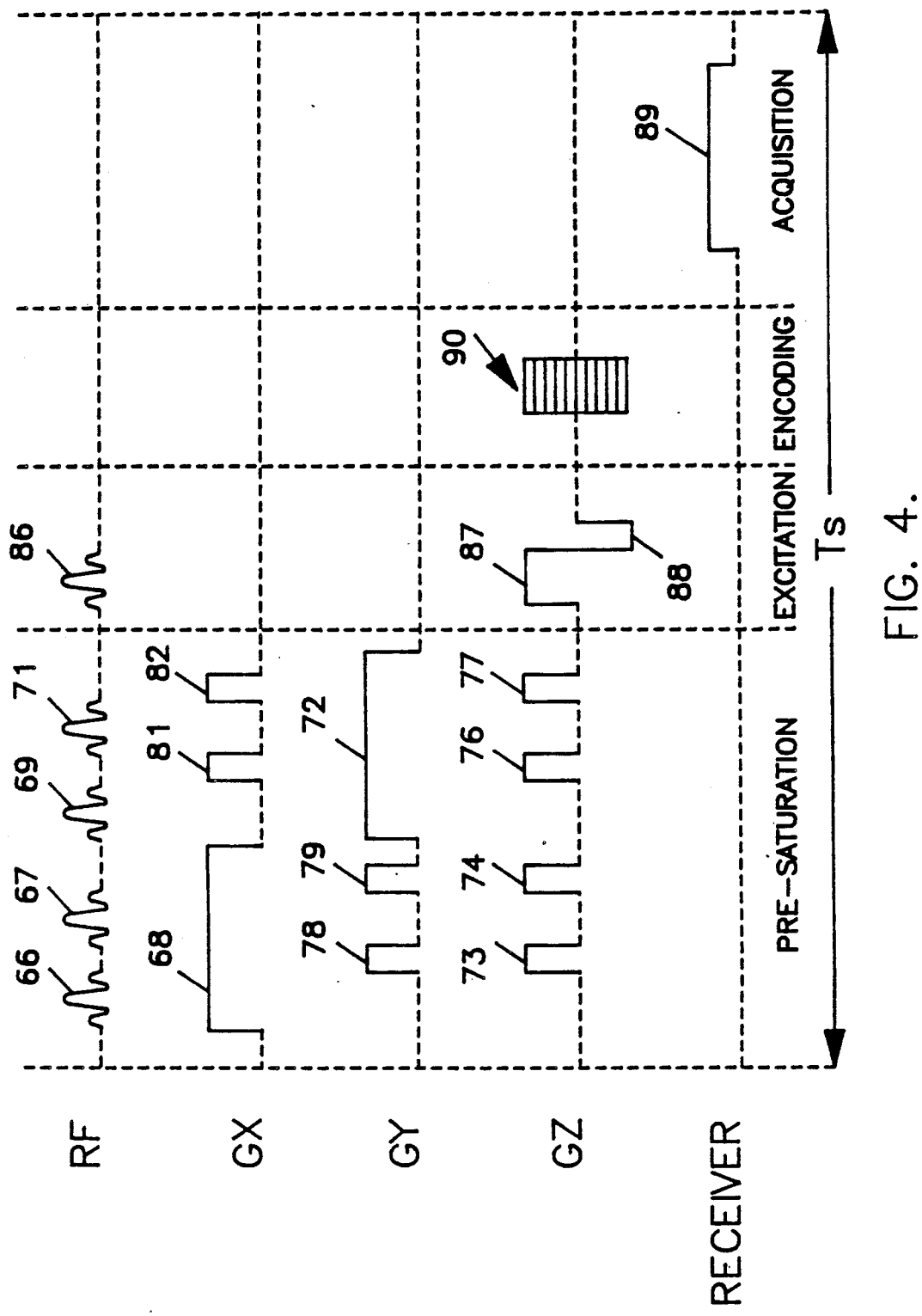
FIG. 4 shows a basic spectroscopic scan sequences using encoding gradient with presaturation according to the invention.

In accordance with the present invention data is acquired using presaturation, excitation and acquisition steps. Encoding is done for imaging and in an embodiment of acquiring spectroscopic data. The presaturation is accomplished using a sequence such as shown in FIG. 4. In the presentation shown in FIG. 4 a first pair of ninety degree RF pulses, pulses 66 and 67, are applied sequentially during the application of a GX gradient pulse 68. The RF pulses are preferably sinc pulses which are used to better define the volume of interest. However, the RF pulses are not limited to sinc shaped pulses, other shapes such as Gaussian can also be used within the scope of the invention. In addition the pulses can be frequency modulated to enable increasing the bandwidth of the pulses without unduly increasing the power deposition.

The RF pulses 66 and 67 applied during the application of the GX gradient pulse 68 cause spins in a localized volume or slab of block 41 to be rotated to be parallel to the ZY plane. The bandwidths of the RF pulses per gradient amplitude determine the width in the X direction of the slabs saturated by the RF pulses. The frequencies of the RF pulses per gradient amplitude determine the location of the saturated slabs. Two 90 degree RF pulses 66 and 67 are used since it is desired to saturate volumes on both sides of the volume of interest 43.

As shown in FIG. 4, a second pair of 90° RF pulses 69 and 71, are subsequently sequentially applied during the application of a GY gradient pulse 72 to saturate slabs at the top and the bottom of the volume of interest 43; i.e., volumes extending in the Y direction. Thus the slabs are XZ planes having thicknesses in the Y direction. The thicknesses are determined by the bandwidths of the RF pulses. The location of the slabs at the top and bottom of the volume of interest are determined by the frequencies of the applied RF pulses and/or the amplitudes of the gradients.

To saturate the slabs in a preferred embodiment, the transverse magnetization (rotated spins) is dephased following each pulse of the sets of RF pulses 66, 67 and 69, 71. This is achieved by continuing the application of each selection gradient pulse after the termination of the RF pulses. To further assure dephasing of the transverse magnetization (i.e. complete saturation) spoiler gradient pulses are used. The spoiler pulses are shown, for example, as GZ spoiler pulse 73 applied after RF pulse 66 and GZ spoiler pulse 74 applied after RF pulse 67. Further GZ spoiler pulses 76 and 77 are applied after the application of RF pulses 69 and 71 respectively. Orthogonal GY spoiler pulses 78 and 79 are applied after RF pulses 66 and 67 respectively. Similarly, Gx spoiler pulses 81 and 82 are applied after RF pulses 69 and 71 respectively.

After the presaturation sequence shown in FIG. 4 the entire block 41 is "saturated" (i.e., the spins are "tipped" to the transverse plant and dephased) except for the VOI 43 which is maintained unsaturated.

FIG. 4 also shows a preferred "chemical shift" type scan sequence for obtaining spectroscopic data from the VOI 43. More particularly, as shown in FIG. 4 an RF pulse, preferably a 90° pulse 86 is applied in the absence of a gradient pulse to excite the entire unsaturated volume. Optionally, a gradient pulse such as pulse 87 having an opposite going portion 88 could be applied during the application of pulse 86. Then radio frequency pulse 86 would have a frequency that operates in conjunction with the Gz gradient pulse 87 to cause FID signals to be acquired from slice 61 during the acquisition period indicated at 89. Signal acquisition occurs during the time indicated by 89.

During spectroscopic data acquisition in-vivo, it is usual to run many scan sequences using the same RF and gradient pulse parameters for averaging purposes. Such averaging is necessary to obtain useable signal-to-noise ratios. In multiple localized volume acquisition as shown in FIG. 4, in addition to the repeat scan for averaging purposes, a series of encoding gradient pulses Gz having different amplitudes shown at 90 are used to acquire data from different localized volumes such as volume 61, 62, etc. If the gradient pulse 87 is applied then the encoding gradient pulses 90 divide up the volume obtained by the RF pulse 86 and the gradient pulse 87. In the usual case where the gradient pulse is not applied, the encoding pulses divide up the entire VOI into multiple localized volumes 21.

Figure 7:
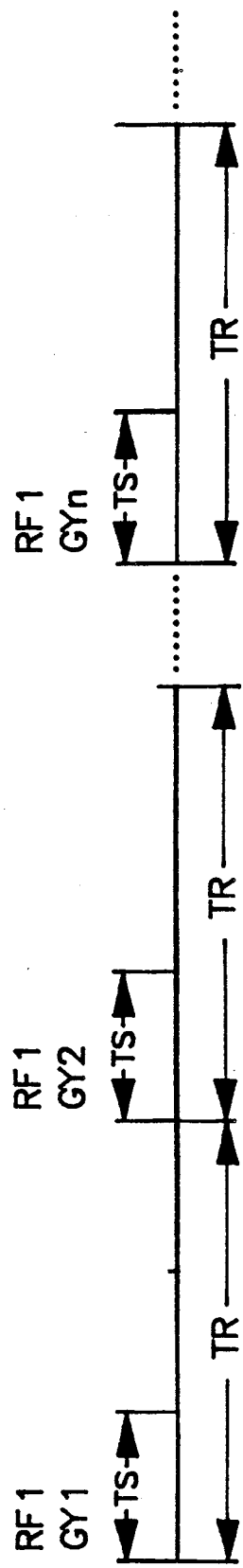
FIGS. 7, 8 and 9 shows the time relationships between the time TS (basic scan sequence time) and the time TR (the definite time period is the time-to-repeat) in the scan sequence of FIGS. 4, 5 and 6, respectively.

The basic scan sequence time for acquisition of data from each localized volume is shown as TS. The basic scan sequence is not repeated until a definite time period TR has transpired. As indicated in FIG. 7, the basic scan sequence with the RF pulse of the first frequency, i.e., $RF_1$, is repeated with different amplitudes $G_{y1}$, $G_{y2}$, ... $G_{yn}$, until the desired spatial resolution is obtained. A basic scan is run per time TR in the "chemical shift" option. Data is also repeatedly acquired from the same volume for averaging purposes. Note that a presaturation sequence is run prior to each excitation step.

There are advantages in using the chemical shift technique of FIG. 4. For example, the selected localized volumes may be contiguous. Also, since a spectra from the VOI can be obtained with a single excitation, it is feasible to shim on the VOI thereby increasing homogeneity.

Figure 5:
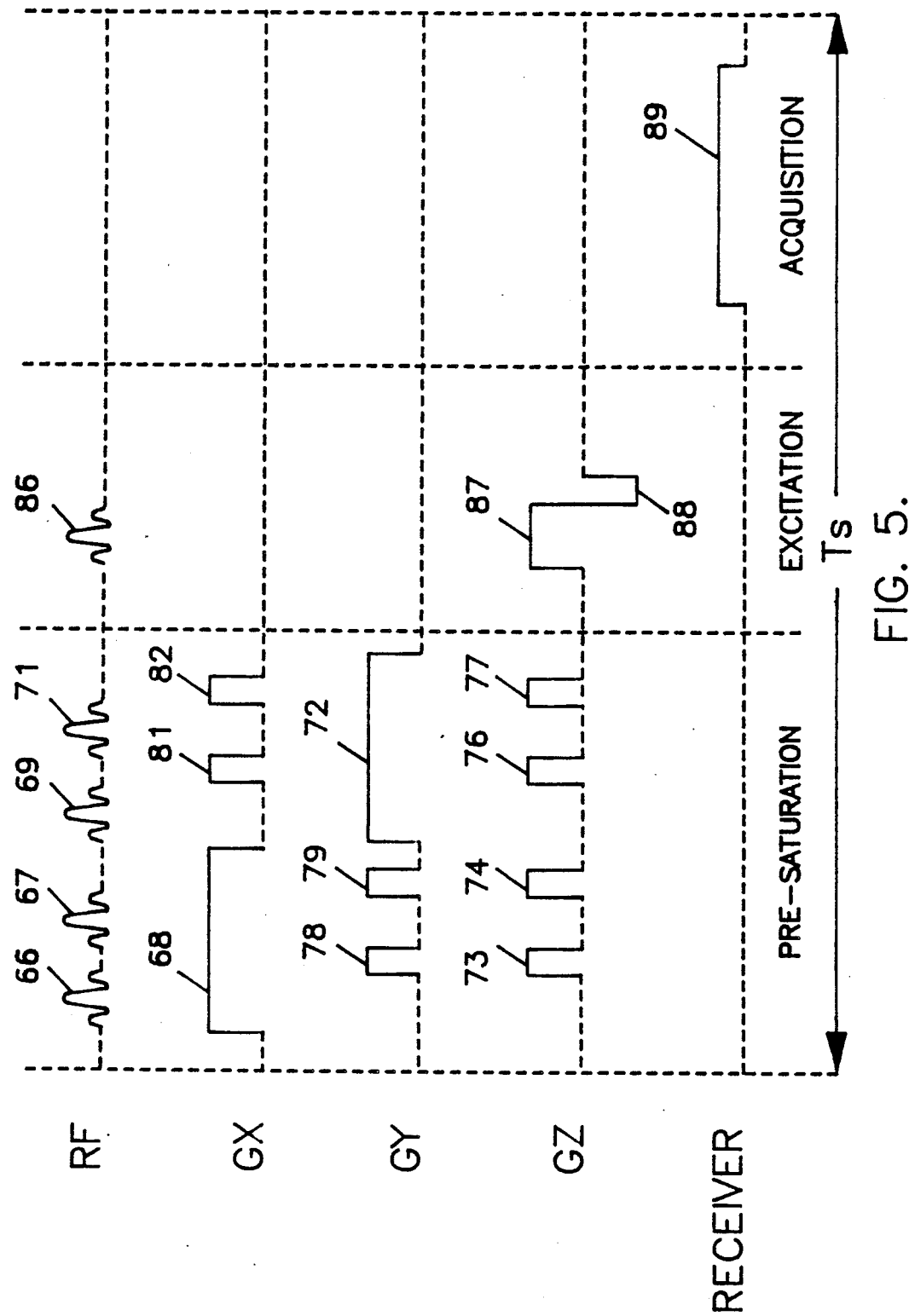
FIG. 5 shows a basic spectroscopic scan sequence without encoding.

FIG. 5 indicates the basic steps for acquiring spectroscopic data from multiple localized volumes in a section of interest. The same presaturation sequence of FIG. 4 is shown. The same reference numbers are used to denote the various pulses applied in FIG. 5 as was used in FIG. 4. Similarly, the same reference numbers are used for the excitation phase of the sequence.

Figure 8:
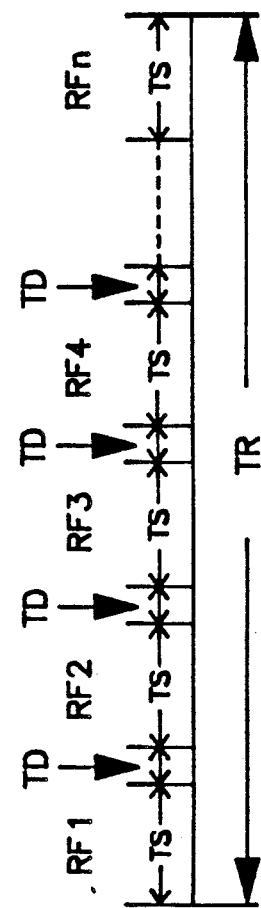

In the sequence of FIG. 5, data from multiple localized volumes are acquired by changing the frequency of RF pulse 86 or the amplitude of gradient pulse 87. As shown in FIG. 8 the sequence is repeated with different pulse parameters such as different frequencies for the RF pulses $RF_1$, $RF_2$, ... $RF_n$ as often as necessary to acquire data from the number of localized volumes desired.

As shown in FIG. 8, the acquisition sequence TS can be run with different frequencies of the RF pulse; i.e., $RF_1$, $RF_2$, ... $R_n$ repeatedly during the time TR. It should be understood that data from localized volumes oriented in other orthogonal directions could be obtained by using orthogonally different encoding gradients.

Figure 6:
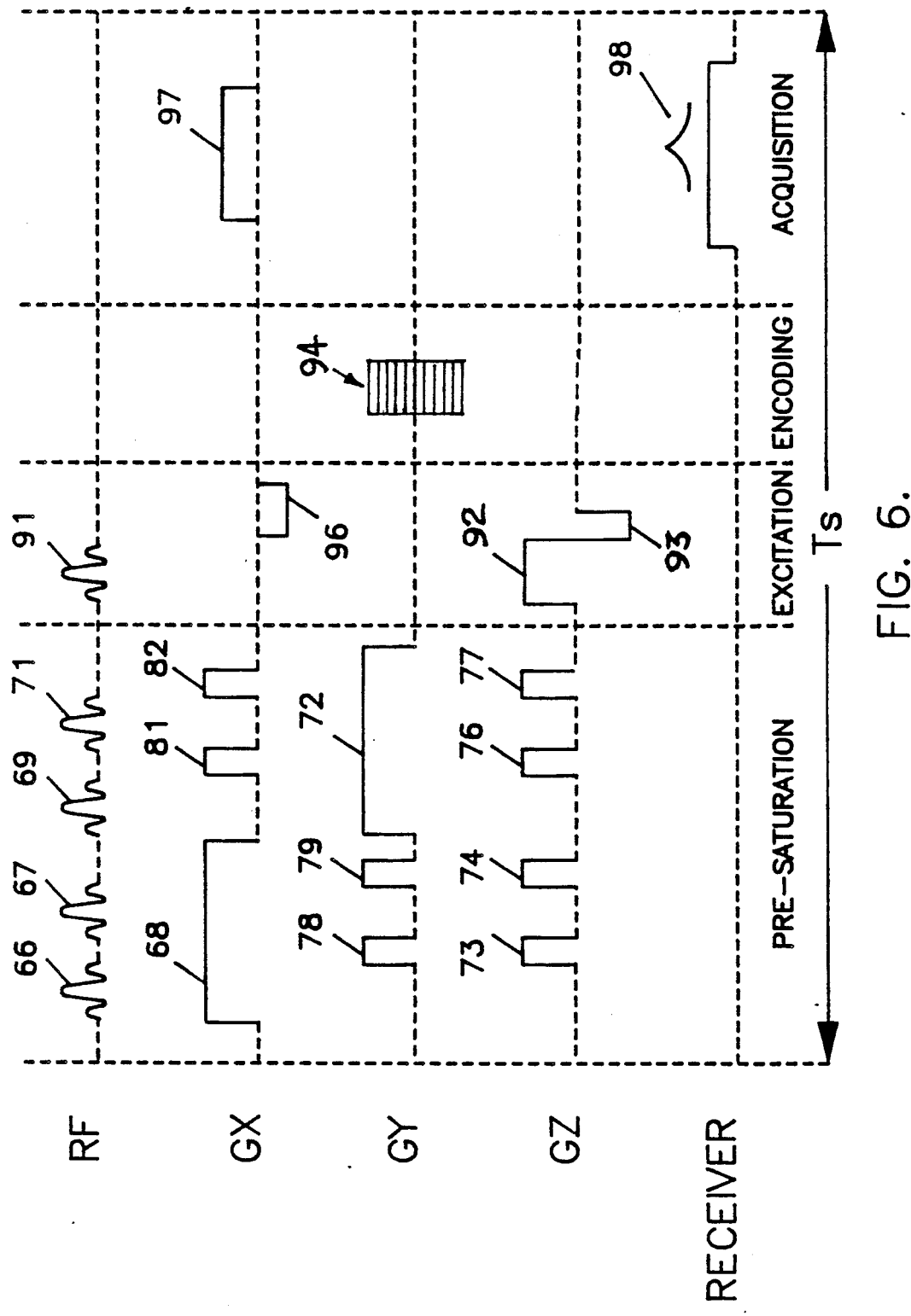
FIG. 6 shows a basic imaging scan sequence for use in the invention.

FIG. 6 shows a basic gradient echo scan sequence used for obtaining imaging data from a localized volume in the VOI 43. After presaturation, a first, preferably sinc shaped, 90 degree RF pulse 91 is applied during the application of a GZ gradient pulse 92. For refocusing purposes, pulse 92 has an opposite-going portion 93. The frequency of pulse 91 in conjunction with the parameter of Gz pulse 92 selects the localized volume.

A series of phase encoding pulses are applied as shown at 94. Each phase encoding pulse enables acquiring data for a different row of pixels, with each pixel corresponding to similarly positioned area in the slice of the subject. The position of the row depends on the amplitude (phase) of the phase encoding pulse. Subsequently, in a well known manner, a negative going view gradient (Gx) pulse 96 is applied to operate in conjunction with Gx gradient pulse 97 to form an echo signal 98 during the acquisition phase. The Gx gradient pulse 97 distinguishes the columns of pixels (time encoding).

The echo pulse is formed when the area under the pulse 96 is equal to the area under pulse 97. It should be understood that other echo forming sequences could be used within the scope of the invention. For the acquisition of imaging data from different localized volumes different RF pulse and/or gradient pulse parameters are used. In addition, a full range of phase encoding pulses indicated at 94 are used.

Figure 9:
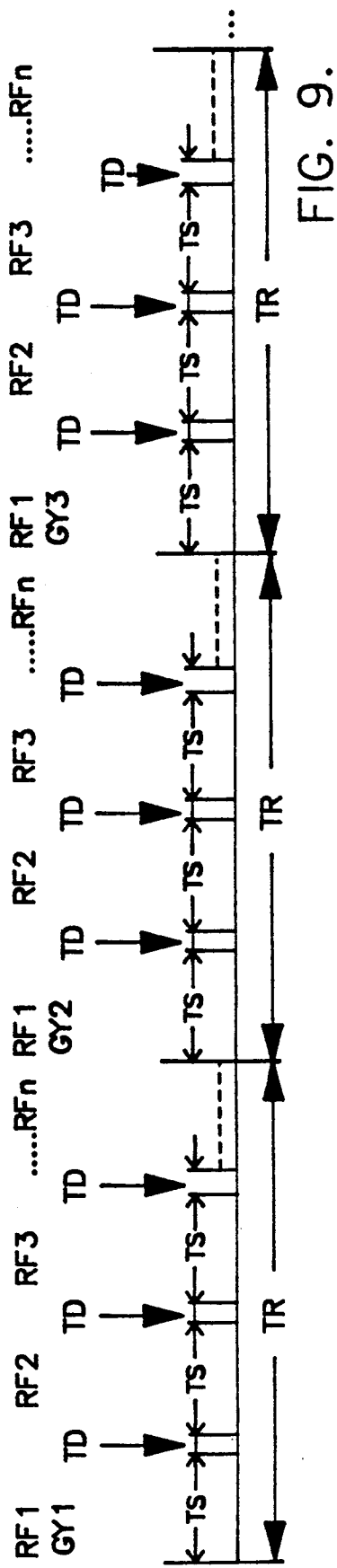

FIG. 9 shows the relationship of the times TR and TS for the imaging sequence of this invention. More particularly, during phase encoding pulse $Gy_1$ a plurality of different localized volumes are chosen by, for example, using RF pulses of different frequencies as indicated by the showing of $RF_1$, $RF_2$, ... $RF_n$. It should be understood that prior art imaging sequences have many TS periods within a TR period. However, no prior art is known that combines the specific presaturation step in the TS period for imaging. Each application of a different RF pulse begins a new time period TS. The time periods TS are separated by slight delay periods denoted as TD. Each different phase encoding pulse provides data for a row of pixels for each radio frequency pulse. As is well known, the time TR is selected to provide the desired contrasts. For imaging, the time TR enables the collection of data for a complete row for all of the selected localized volumes. The sequence of FIG. 6 is repeated for each phase encoding pulse so that data is collected for all of the rows for all of the selected localized volumes as indicated in FIG. 9. For averaging purposes, the data acquisition sequences of FIG. 9 are repeated.

Thus, in the sequences shown in FIGS. 4, 5 and 6 the application of the RF pulses and the gradient pulses causes FID signals to be acquired from the different localized volumes which can then be used for spectroscopy (FIGS. 4 and 5) or for imaging (FIG. 6).

According to the inventive method and apparatus, either spectroscopic or imaging data is acquired from a multiplicity of selected localized volumes in a volume of interest. The acquisition is accomplished by using a presaturation sequence (prior to every excitation sequence) wherein the volumes not of interest are saturated leaving a volume of interest unsaturated. After the saturation, scan sequences are applied that generate a plurality of signals from a multiplicity of selected localised volumes in the volume of interest. For imaging, a series of phase encoding gradients are applied and a view selecting gradient is also applied. In addition, preferably a gradient echo sequence is used. Spectroscopic data is collected from the localized volumes either by selecting the localized volumes with an RF signal and a slab selecting gradient (FIG. 5) or by chemical shift type phase encoding (FIG. 4).

In the method of the invention, the acquisition of imaging data from a multiplicity of localized volumes occurs in practically the time required for acquiring data from a single localized volume. The method enables the acquisition of either spectroscopic data or imaging data from localized volumes in particular volumes of interest without adverse eddy current effects and with a fine definition of the volume. The scan sequence is sufficiently fast to acquire 31P data with no relaxation period problem. The power deposition is low because even though the RF pulses have relatively wide bandwidths, fewer such RF pulses are used or frequency modulated pulses are used. The power usage in this described system compared to the power usage in other systems, assures a more efficient system.

The system as described herein can operate with short sequences. Therefore, the system substantially reduces the T1 dependency. The time between the saturation sequence and the data acquisition sequence is varied as required to reduce eddy current effects. Also, the size and location of the localized volumes from which data is acquired in the volume of interest can be varied by varying the bandwidth and/or RF frequency of the pulses and/or strength of the selecting gradients.

While the foregoing invention has been described using preferred embodiment, it should be understood that the preferred embodiments are shown by way of example only and not as limitations on the scope of the invention.

What is claimed is:

1. A method for acquiring data from at least one localized volume in a volume of interest (VOI) during a magnetic resonance (MR) examination, said method comprising the steps of:
   determining a VOI in a patient that is the subject of an MR examination,
   subjecting a patient to a strong static magnetic field,
   presaturating volumes surrounding the VOI leaving only the VOI unsaturated, said step of presaturating the volumes surrounding the volume of interest comprising the steps of:
   applying a pair of RF pulses during the application of a first gradient pulse to tip spins into transverse planes in volumes juxtaposed to both sides of said VOI,
   applying a second pair of RF pulses during the application of a second gradient pulse to tip spins into transverse planes in volumes juxtaposed to the top and the bottom of said VOI,
   dephasing said tipped spins to saturate the volumes juxtaposed to the VOI,
   selecting a plurality of localized volumes from the VOI,
   said selecting step including:
   applying gradient pulses to determine the original of free induction decay (FID) signals,
   applying radio frequency (RF) pulses in the presence of the gradient pulses to generate FID signals in the plurality of localized volumes, and
   processing the FID signals to provide usable data from the MR examination.

2. A system for acquiring data from a plurality of localized volumes in the volume of interest (VOI) during a magnetic resonance (MR) examination, said system comprising
   means for determining a VOI in a patient that is a subject of an MR examination,
   means for subjecting the patient to a strong static magnetic field,
   means for presaturating volumes surrounding the VOI leaving only the VOI unsaturated,
   said means for presaturating the volumes surrounding the VOI comprising:
   means for applying a pair of RF pulses during the application of the first gradient pulse to tip spins into transverse planes in volumes juxtaposed to both sides of said VOI,
   means for applying a second pair of RF pulses during the application of a second gradient pulse to tip spins into transverse planes in volumes juxtaposed to the top and the bottom of said VOI, and
   means for dephasing said tipped spins to saturate said volumes juxtaposed to said VOI,
   selecting means for selecting a plurality of localized volumes from the VOI, said selecting means including:
   means for applying radio frequency (RF) pulses to generate free induction decay (FID) signals in the plurality of selected localized volumes,
   means for applying gradient pulses to determine the source of the FID signals,
   means for detecting the FID signals, and
   means for processing the detected FID signals to provide usable data from the MR examination.

3. The method of presaturating volumes surrounding the VOI of claim 1 wherein said dephasing step includes the steps of applying spoiler gradient pulses between said RF pulses of said first and said second pair of RF pulses.

4. The method of claim 3 including the step of applying spoiler gradient pulses after the application of each pair of RF pulses.

5. The method of claim 1 wherein the step of acquiring data from a multiplicity of localized volumes includes the steps of:
   applying a basic data generating scan sequence requiring a time period TS to obtain data from a selected one of said localized volumes, said basic data acquisition scan sequence including the application of an RF pulse in the presence of a volume localizing gradient pulse.
   said volume localizing gradient pulse in cooperation with said RF pulse having parameters for generating free induction decay (FID) signals from a first localized volume in the VOI in said patient,
   waiting a definite period TR before reapplying said basic sequence, and
   reapplying the basic scan sequence during the definite period with pulses of different parameters for selecting and acquiring data from other slabs in said patient during said definite period.

6. The method of claim 5 wherein said different parameters include different frequencies for said RF pulses.

7. The method of claim 5 wherein said different parameters include gradient pulses of different areas.

8. The method of claim 5 wherein said different parameters include different bandwidths for said RF pulse.

9. The method of claim 6 including applying multiple RF pulses of different frequencies in the presence of different gradient pulses to select a multiplicity of localized volumes in the patient, and
applying a plurality of RF pulses of the same frequency during the application of gradient pulses of the same amplitudes to obtain a plurality of signals from each of the slabs selected by the multiple RF pulses, and
averaging said plurality of signals to obtain a useable signal-to-noise ratio.

10. The methods of claim 5 wherein said RF pulses used for saturation purposes are sets of frequency modulated 90° RF pulses.

11. The method of claim 5 wherein said step of applying a basic scan sequence comprises using a gradient echo sequence.

12. The methods of claim 1 wherein the step of acquiring data from a multiplicity of localized volumes includes applying a basic spectroscopic data generating scan sequence.

13. The methods of claim 12 including the step of applying a chemical shift sequence by applying a series of phase encoding gradient pulses after each application of the volume selecting pulses.

14. The system of presaturating volumes surrounding the VOI of claim 2 wherein said means for dephasing includes means for applying spoiler gradient pulses between said RF pulses of said first and said second pair of RF pulses to assure that said volumes juxtaposed to said VOI are saturated.

15. The system of claim 2 including means for applying spoiler gradient pulses after the application of each pair of RF pulses.

16. The system of claim 2 wherein said means for acquiring data from selected multiple localized volumes includes:
means for applying a basic data acquisition scan sequence over a time period TS to obtain data from a selected one of said multiple slices, said means for applying a basic data acquisition scan sequence including means for applying a first RF pulse in the presence of a volume selecting gradient pulse,
said volume selecting gradient pulse in cooperation with said first RF pulse having parameters for generating FID signals from a first localized volume in the VOI in said patient,
means for waiting a definite period TR before reapplying said basic sequence with said first RF pulse, and means for reapplying the basic scan sequence during the definite period TR with pulses of different parameters for selecting and acquiring data from other localized volumes in the VOI in said patient during said definite period.

17. The system of claim 16 wherein said different parameters include different frequencies for said RF pulses.

18. The system of claim 16 wherein said different parameters include gradient pulses of different amplitudes.

19. The system of claim 16 wherein said different parameters include different bandwidths for said RF pulses.

20. The method of claim 14 including means for applying multiple RF pulses of different frequencies in the presence of different gradient pulses to select multiple localized volumes in the patient, and
means for applying a plurality of RF pulses of the same frequency during the application of gradient pulses of the same amplitudes to obtain a plurality of signals from each of the localized volumes selected by the multiple RF pulses, and
averaging said plurality of signals to obtain a useable signal-to-noise ratio.

21. The system of claim 17 wherein said RF pulses used for saturation purposes are sets of frequency modulated 90° RF pulses.

22. The system of claim 16 wherein said means for applying a basic scan sequence comprises means for applying a gradient echo sequence.

23. The system of claim 2 wherein said system for acquiring data from said plurality of localized volumes comprises means for applying a basic spectroscopic data generating scan sequence.

24. The system of claim 23 including means for applying a chemical shift sequence by applying a series of phase encoding gradient pulses after each application of a volume selecting pulse to select a series of localized volumes.

* * * * *